United States Patent [19]

Needham et al.

[11] 4,187,214

[45] Feb. 5, 1980

[54] FIRE RETARDANT ADHESIVE POLYOLEFIN COMPOSITIONS

[75] Inventors: Donald G. Needham; Ray D. Griffin, both of Bartlesville, Okla.

[73] Assignee: Phillips Petroleum Company, Bartlesville, Okla.

[21] Appl. No.: 640,087

[22] Filed: Dec. 12, 1975

Related U.S. Application Data

[62] Division of Ser. No. 412,282, Nov. 2, 1973, Pat. No. 3,940,547.

[51] Int. Cl.² .............................................. C08K 5/16
[52] U.S. Cl. .................... 260/45.9 KA; 260/45.7 RL; 260/45.9 NP
[58] Field of Search ............... 260/45.9 NP, 45.9 KA, 260/45.7 RL

[56] References Cited

U.S. PATENT DOCUMENTS

| | | | |
|---|---|---|---|
| 3,158,588 | 11/1964 | Johnson | 260/45.7 R |
| 3,649,591 | 3/1972 | Murray et al. | 260/45.9 NP |
| 3,908,067 | 9/1975 | MacKenzie et al. | 260/45.75 B |

*Primary Examiner*—V. P. Hoke

[57] ABSTRACT

Combination of a polyolefin; a crosslinking agent; a halogenated phosphorous-nitrogen compound having the formula

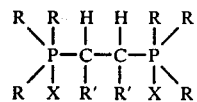

where R' is selected from the group consisting of hydrogen and alkyl radicals having 1 to 3 carbon atoms, R is a cyano alkyl radical having 2 to 6 carbon atoms and X is chlorine, bromine, or iodine; ammonium polyphosphate; and hexachlorocyclopentadiene dimer yields a composition which is strong, fire-retardant and also strongly adherent to certain surfaces including aluminum.

9 Claims, No Drawings

FIRE RETARDANT ADHESIVE POLYOLEFIN COMPOSITIONS

This application is a division of copending application Ser. No. 412,282, filed Nov. 2, 1973, now U.S. Pat. No. 3,940,547.

This invention relates to the bonding of polymers to other materials. In another aspect it relates to the use of fire-retardant additives to increase the bonding strength of polymers. In still another aspect it relates to the use of adhesive polymers to form laminates. In yet another aspect it relates to fire-retardant coatings.

Various flame-retardant additives have been used in the past to reduce the flammability rating of polymers or polymeric systems. During the course of experiments to develop fire-retardant polymers, it has been unexpectedly discovered that combining certain fire-retardant additives and a crosslinking agent with a polyolefin yields a polymeric product which has a significant improvement in useful adhesive qualities. In addition to forming a strong bond with polyamides, polyesters, other polyolefins, rubbers, and similar polymeric compositions, the improved composition is particularly adherent to aluminum. The composition is, therefore, useful as a fire-resistant coating for any of those materials to which it adheres and is also a good adhesive for use in forming laminates of such materials.

Accordingly, an object of this invention is to provide an improved polymer having both a high resistance to fire and good adhesive characteristics. A further object is to provide a process for bonding a fire-resistant polymer to aluminum. Still another object is to provide a useful combination of a fire-resistant polymer bonded to another material. Yet another object is to provide laminates using a fire-resistant polymer as a bonding material. Another object is to provide a fire-retardant coatings for a variety of materials.

In accordance with the invention, a normally solid, thermoplastic polyolefin is combined with a crosslinking agent, a halogenated phosphorus-nitrogen compound, ammonium polyphosphate, and a hexachlorocyclopentadiene dimer. The resulting composition is both strong and fire resistant and is capable of forming a strong bond with certain other materials.

Although the use of any polyolefin is considered to be within the scope of this invention, the preferred polyolefin is polyethylene, more particularly an ethylene homopolymer, a copolymer of ethylene and at least one acyclic straight or branch chain mono-1-olefin hydrocarbon having 3 to 8 carbon atoms per molecule, or mixtures of such homopolymers, or such copolymers, or of at least one such homopolymer and at least one such copolymer. A presently preferred group of such hydrocarbon comonomers are the straight chain 1-olefin hydrocarbons, particularly those straight chain 1-olefin hydrocarbons hav 3 to 6 carbon atoms per molecule. The copolymers are usually formed with ethylene constituting at least 75 weight percent of the total monomers. Specific copolymers of ethylene include, for example, copolymers of ethylene and 1-butene, copolymers of ethylene and propylene, copolymers of ethylene and isobutene, copolymers of ethylene and 1-pentene, copolymers of ethylene and 3-methyl-1-butene, copolymers of ethylene and 1-hexene, copolymers of ethylene and 4-methyl-1-pentene, copolymers of ethylene and 1-heptene, copolymers of ethylene and 1-octene, copolymers of ethylene and 4-ethyl-1-hexene, and blends thereof.

In general, the polymer of ethylene employed will have a melt index of at least about 10, based on ASTM D1238-70, Condition E, a density in the range of about 0.92 to about 0.97, based on ASTM D-1505-68, preferably in the range of about 0.940 to about 0.965. The polymer used will generally have a melt index in the range of about 10 to about 200, with polymers having a melt index in the range of about 10 to about 50 being presently preferred. The polymers can be produced by any suitable method and can be selected from among those commercially available where desired.

Crosslinking compounds which are considered to be suitable are the acetylenic diperoxy compounds, which includes the hexynes having the formula

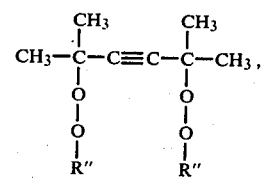

octynes having the formula

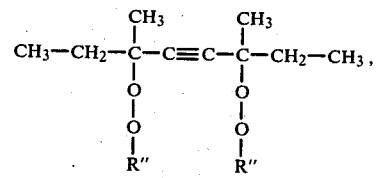

and octadiynes having the formula

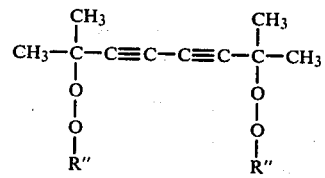

wherein R" is selected from the group consisting of tertiary alkyl, alkoxy-carbonyl, and benzoyl. In general, the molecular weight of the diperoxy compounds will fall within the range of about 230 to about 550. Excellent results are received with the above-noted hexynes. Among the compounds encmpassed within the above-noted hexynes, octynes, and octadiynes are:

2,7-dimethyl-2,7-di(t-butylperoxy)octadiyne-3,5
2,7-dimethyl-2,7-di(peroxy ethyl carbonate)octadiyne-3,5
3,6-dimethyl-3,6-di(peroxy ethyl carbonate)octyne-4
3,6-dimethyl-3,6(t-butylperoxy)octyne-4
2,5-dimethyl-2,5-di(peroxybenzoate)hexyne-3
2,5-dimethyl-2,5-di(peroxy-n-propyl carbonate)hexyne-3
2,5-dimethyl-2,5-di(peroxy isobutyl carbonate)hexyne-3
2,5-dimethyl-2,5-di(peroxy ethyl carbonate)hexyne-3
2,5-dimethyl-2,5-di(alpha-cumyl peroxy)hexyne-3
2,5-dimethyl-2,5-di(peroxy beta-chloroethyl carbonate)hexyne-
2,5-dimethyl-2,5-di(t-butylperoxy)hexyne-3.

A preferred crosslinking agent for use in the present invention is 2,5-dimethyl-2,5-di(t-butylperoxy)-hexyne- 3. In general, the amount of the crosslinking agent will be in the range of about 0.1 to about 10, preferably in the range of about 0.5 to about 3, parts by weight per 100 parts by weight of the polymer of ethylene.

The halogenated phosphorus-nitrogen compound employed is represented by the formula

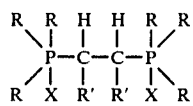

where R' is H or an alkyl radical having from 1 to 3 carbon atoms, R is a cyano alkyl radical having from 2 to 6 carbon atoms, and X is Cl, Br, or I. Specific examples of compounds considered to be suitable include propylene 1,2-bis[tris(2-cyano-butyl)phosphonium chloride], 2,3-butylene-bis tris(cyano-propyl)phosphonium iodide], and the presently preferred ethylene 1,2-bis[tris(2-cyano-ethyl)phosphonium bromide]. The concentration of this component can be within the range of about 2.0 to about 7.5 percent by weight based on the polyolefin with a value in the range of about 2.5 weight percent to about 5 weight percent preferred.

The ammonium polyphosphate additive can be produced by the reaction of ammonia and phosphoric acid, with at least 45 percent of the resulting phosphate being in the form of polyphosphates, i.e., a mixture of dimers, trimers, and tetramers of phosphoric acid. The concentration of ammonium polyphosphate can be within the range of about 2 percent to about 7.5 percent by weight based on the weight of polyolefin, with a range of about 2.5 weight percent to about 5 weight percent being preferred.

The dimer of hexachlorocyclopentadiene ($C_{10}Cl_{12}$) employed in the invention is characterized by a melting point of 485° C., a refractive index (20° C.) of 1.627, and a density of 2.02 g/cc. The concentration of this component can be within the range of about 5 percent to about 20 percent by weight based on the weight of polyolefin with a range of about 7 weight percent to about 14 weight percent being preferred.

The polyolefin base, crosslinking agent, and other ingredients can be combined by any method to form a mixture of substantially uniform composition. Blending by means of tumble mixing, pelletizing the components of the composition, or a combination of these procedures are considered to be satisfactory means of mixing the ingredients. A preferred method is to tumble mix a pelletized combination of polyolefin and crosslinking agent with the other components.

The mixed polyolefin composition can be bonded or laminated to a desired surface using any technique suitable for bonding a polyolefin to another material. Compression molding has been found to work well when laminating a polyolefin to a thin material such as metal foil. Suitable bonding conditions include a pressure within the range of 0 psi to about 1000 psi or abve and a temperature within the range of about 350° F. to about 500° F. for a period of time suitable to permit a crosslinking reaction to take place within the polyolefin composition, usually within the range of about 4 to about 10 minutes. The preferred conditions for laminating a polyethylene composition with aluminumfoil of approximately 5 mil thickness are a pressure of about 600 psi and a temperature of about 400° F. for a period of about 5 minutes.

Bonded products and laminates manufactured in accordance with the invention using suitable substrates have strongly adherent bonds, are fire retardant and, in some cases, fire resistant, and have the high strength and stress crack resistance of the crosslinked polyethylene used as a base for the composition. Uses of laminates so formed, for example, include, but are not limited to, metal surfaced boards for printed circuits, etch plates, heat shields, and other similar items. Because the polyolefin composition acquires adhesive porperties and flame-retardant qualities without giving up the aesthetic appearance, strength and electrical insulating properties of the crosslinked polyolefin, the new composition lends itself to hundreds of uses which would otherwise require the use of a separate adhesive to bond the polyolefin to another surface.

The composition is also considered to be useful in bonding with many other normally solid organic thermoplastic materials, including polyamides such as nylon 6—6 and nylon 6, polyesters such as polyethylene tereph thalate, other uncrosslinked polyolefins such as polypropylene, natural rubber and synthetic rubbers such as acrylonitrile-butadiene-styrene terpolymers, ethylene, propylene, diene terpolymers, and butadienestyrene copolymers. In addition to bonding a polyolefin composition to these and other substrates, formation of laminates using various substrates or combinations of substrates bonded with the composition of the invention and coating of suitable surfaces are considered to be within the scope of the invention. In a preferred embodiment, polyethylene in combination with a crosslinking agent and fire-retardant compounds is bonded to aluminum.

It has been found that an improved polyethylene composition which bonds well with aluminum does not show improved adherence to copper. A composition which bonds well with aluminum has in fact been shown to bond less readily to copper than crosslinked polyolefin without additives.

EXAMPLE I

An ethylene homopolymer having a density of 0.965 and a melt index of 30; 2,5-dimethyl-2,5-di(t-butylperoxy)-hexyne-3; ethylene-bis[tris(2-cyanoethyl)phosphonium bromide]; ammonium polyphosphate with 45% of the phosphates being in the form of polyphosphates; and hexachlorocyclopentadiene dimer were admixed in various proportions. Each of the resulting blends was applied in powder form to a substrate of 5 mil aluminum foil strip 1 inch wide which had been cleaned by wiping with acetone and air dried. The cleaned aluminum and polyethylene mixture were compression molded at a pressure of 600 psi at 400° F. for five minutes. Control runs were made using ethylene homopolymer alone and using only the ethylene homopolymer-crosslinking agent combination. The strength of the bond formed with aluminum for the various combinations is shown in the following table:

TABLE I

| Run No. | 2,5-dimethyl-2,5-di(t-butylperoxy)-hexyne-3 | Ethylene bis-[tris(2-cyanoethyl)phosphonium bromide] | Ammonium polyphosphate | Hexachlorocyclopentadiene Dimer | Peel Strength lbs. |
|---|---|---|---|---|---|
| | \multicolumn{4}{c}{Additive Concentration as Percentage by Weight of Polyethylene} | | |
| 1 | 0 | 0 | 0 | 0 | 2.1 |
| 2 | 0 | 0 | 0 | 14 | 1.7 |
| 3 | 0 | 5 | 5 | 0 | 4.0 |
| 4 | 0 | 5 | 5 | 14 | 1.0 |
| 5 | 0.75 | 0 | 0 | 0 | 5.3 |
| 6 | 0.75 | 0 | 0 | 7 | 7.9 |
| 7 | 0.75 | 2.5 | 2.5 | 0 | 3.5 |
| 8 | 0.75 | 0 | 0 | 14 | 4.7 |
| 9 | 0.75 | 5 | 5 | 0 | 6.5 |
| 10 | 0.75 | 2.5 | 2.5 | 7 | 13.3* |
| 11 | 0.75 | 5 | 5 | 14 | 13.3* |

*Bonding strength was sufficient to cause the foil to tear or break at 13.3 lbs. peel strength instead of pulling away from the polymeric composition.

As shown by the table, maximum usable bonding strength was obtained using fairly low concentrations of fire-retardant additives, and increasing these concentrations to obtain increased fire resistance did not adversely affect the usable bonding strength. Separate testing of the polymeric composition with the composition of Run 11 from Table I showed the composition to be self-extinguishing in air.

EXAMPLE II

The procedure of Example I was used to test bonding strength for copper using copper foil 6 mils thick which had been cleaned by wiping with acetone and air dried. The results of this procedure are shown in Table II:

TABLE II

| Run No. | 2,5-dimethyl-2,5-di(t-butylperoxy)-hexyne-3 | Ethylene bis-[tris(2-cyanoethyl)phosphonium bromide] | Ammonium polyphosphate | Hexachlorocyclopentadiene Dimer | Peel Strength lbs. |
|---|---|---|---|---|---|
| | \multicolumn{4}{c}{Additive Concentration as Percentage by Weight of Polyolefin} | | |
| 12 | 0.75 | 0 | 0 | 0 | 5.1 |
| 13 | 0.75 | 0 | 0 | 14 | 4.7 |
| 14 | 0.75 | 5 | 5 | 0 | 1.1 |
| 15 | 0.75 | 2.5 | 2.5 | 7 | 3.2 |
| 16 | 0.75 | 5 | 5 | 14 | 3.2 |

As shown by Table II, bonding strength with copper was not improved by addition of flame-retardant materials. This further points out the unique and unexpected nature of the bonding strength with aluminum.

Reasonable variations and modifications are possible within the scope of the foregoing disclosure and the appended claims to the invention.

We claim:

1. A fire retardant composition having improved adhesion to aluminum, said composition comprising a normally solid, thermoplastic polyolefin; a crosslinking agent; a halogenated phosphorus-nitrogen compound having the formula

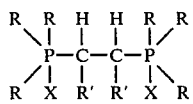

wherein R' is H or an alkyl radical having from 1 to 3 carbon atoms, R is a cyano alkyl radical having from 2 to 6 carbon atoms and X is chlorine, bromine, or iodine; ammonium polyphosphate having at least 45 percent of the phosphate in the form of polyphosphates; and a dimer of hexachlorocyclopentadiene wherein the concentrations of each of said halogenated phosphorus-nitrogen compound and said ammonium polyphosphate are in the range of about 2 percent to about 7.5 percent based on the weight of said polyolefin, and wherein the concentration of hexachlorocyclopentadiene dimer is within the range of about 5 percent to about 20 percent by weight based on the weight of said polyolefin.

2. A composition in accordance with claim 1 wherein said polyolefin is a polymer of ethylene having a density in the range of from about 0.92 to about 0.97 and wherein said crosslinking agent comprises from about 0.1 to about 10 percent by weight based on the weight of said polymer of ethylene.

3. A composition in accordance with claim 2 wherein said crosslinking agent is selected from the group consisting of hexynes having the formula

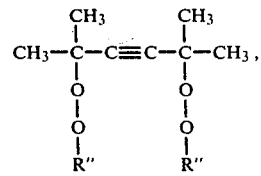

octynes having the formula

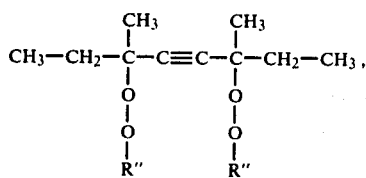

and octadiynes having the formula

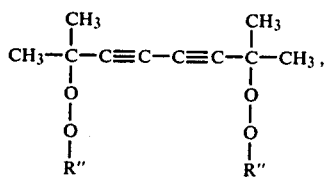

wherein R" is selected from the group consisting of tertiary alkyl, alkcarbonyl, and benzoyl.

4. A composition in accordance with claim 2 wherein the concentrations of each of said halogenated phosphorus-nitrogen compound and said ammonium polyphosphate are in the range of from about 2.5 to about 5% based on the weight of said polymer of ethylene and wherein the concentration of hexachlorocyclopentadiene dimer is within the range of from about 7% to about 14% by weight based on the weight of said polymer of ethylene.

5. A composition in accordance with claim 4 wherein said crosslinking agent is selected from the group consisting of hexynes having the formula

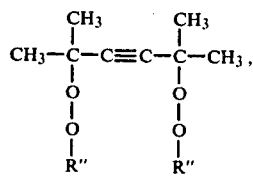

octynes having the formula

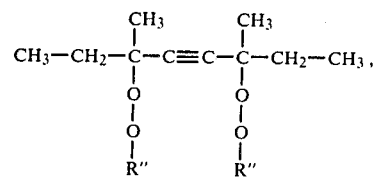

and octadiynes having the formula

CH₃—C—C≡C—C≡C—C—CH₃, wherein R" is selected from the group consisting of tertiary alkyl, alkoxycarbonyl, and benzoyl.

6. A composition in accordance with claim 5 comprising from about 0.5 to about 3 parts by weight of said crosslinking agent per 100 parts by weight of said polymer of ethylene.

7. A composition in accordance with claim 1 wherein the concentrations of each of said halogenated phosphorus-nitrogen compound and said ammonium polyphosphate are in the range of from about 2.5% to about 5% based on the weight of said polyolefin, and wherein the concentration of hexachlorocyclopentadiene dimer is in the range of from about 7% to about 14% by weight based on the weight of said polyolefin.

8. A composition according to claim 6 wherein said crosslinking agent is 2,5-dimethyl-2,5-di(t-butylperoxy)-hexyne-3, said halogenated phosphorus-nitrogen compound is ethylene-bis[tri(2-cyano-ethyl) phosphonium bromide], and said ammonium polyphosphate has 45 percent of the phosphates in the form of polyphosphate.

9. A composition according to claim 1 comprising from about 0.1 to about 10 parts by weight of said crosslinking agent per 100 parts by weight of said polyolefin.

* * * * *